(12) United States Patent
Cook

(10) Patent No.: US 6,496,014 B1
(45) Date of Patent: Dec. 17, 2002

(54) CABLE TESTER ERROR COMPENSATION METHOD AND APPARATUS

(75) Inventor: Ron D. Cook, Littleton, MA (US)

(73) Assignee: Agilent Technologies, Inc., Palo Alto, CA (US)

( * ) Notice: Subject to any disclaimer, the term of this patent is extended or adjusted under 35 U.S.C. 154(b) by 88 days.

(21) Appl. No.: 09/618,396

(22) Filed: Jul. 18, 2000

(51) Int. Cl.$^7$ .............................. H04B 3/46; G01R 1/04
(52) U.S. Cl. ......................... 324/539; 324/538; 324/66
(58) Field of Search ................... 324/539, 538, 324/540, 66; 702/56

(56) References Cited

U.S. PATENT DOCUMENTS

| | | | | |
|---|---|---|---|---|
| 5,027,074 A | * | 6/1991 | Haferstat ................... | 324/539 |
| 5,541,840 A | * | 7/1996 | Gurne et al. ............ | 364/424.03 |
| 5,629,617 A | * | 5/1997 | Uhling et al. ............ | 324/158.1 |
| 5,919,248 A | * | 7/1999 | Kahkosha et al. .......... | 709/224 |
| 6,006,164 A | * | 12/1999 | McCarty et al. ............. | 702/56 |

OTHER PUBLICATIONS

"Electrical and HVAC Tools" FLUKE Corporation, 2001.*
"Handheld Standards Thermometer" NIST, 2001.*
"Application Specific Probes—The Key ti Specific Coating Measurement" Fischer Corporation, Feb. 1998.*
"MS1500E Handheld ER Corrosion Data Logger" Metal Samples, 2002.*
"An Analysis Of Vector Measurement Accuracy Enhancement Techniques", Hewlett–Packard Company (Rytting), 1986.

* cited by examiner

Primary Examiner—N. Le
Assistant Examiner—T. R. Sundaram

(57) ABSTRACT

A probe for a cable tester having a first interface for connection to the cable tester; a second interface, connected to the first interface, for connection to a cable to be tested; and a memory, associated with the probe and accessible by the cable tester, storing configuration data associated with the probe.

19 Claims, 7 Drawing Sheets

CABLE TESTER ERROR COMPENSATION METHOD AND APPARATUS

BACKGROUND OF THE INVENTION

The present invention relates to methods and apparatus for storing data, including error compensation data, locally on probes for use with a cable tester so as to enable accurate identification, maintenance and error correction of data obtained via the probe.

The challenge to manufacturers of cables and connectors has been to improve the performance of their products to provide a better transmission environment for ever-higher data transmission rates. At present, the structured cabling industry is transitioning from category 5 products and standards to category 6 products and standards. This transition will continue for some time as product innovation continues and as standards documents continue to evolve. Cable manufacturers employ a wide variety of materials and construction techniques to improve the performance of cable to meet the new standards. Recent emphasis has been on reducing process variations and optimizing cable construction in an effort to reduce crosstalk between pairs and reflections within pairs.

To ensure that structured cabling systems provide adequate performance to support the utilized application interfaces, cabling standards committees have developed quality control specifications for the installation of new cabling. Cable testers provide a convenient and reliable means of certifying new installations for compliance with structured cabling standards. Standards for structured twisted pair cabling require that both ends of each cabling run be tested in order to find the worst case performance condition. For this reason, all certification testing requires a two-part test set, consisting of a main unit and a remote unit. One unit tests the cabling run from the telecommunications closet end and the other unit tests the cabling run from the telecommunications outlet end at the user location.

Certification testing is highly automated. Typically, an automated function coordinates a series of measurements between the main unit and the remote unit and subsequently analyzes the resulting data to determine if the cabling run passes or fails the required standards. Two key criteria apply in determining the extent of a test for any particular cabling run:

1) Whether the user patch cords are included in the cabling run during the test (i.e., "Link" or "Channel" test configuration)
2) What standard document and which performance level the user wishes to test the cabling to (i.e., for what "category" is the user seeking certification)

FIG. 1 is a diagram of a known testing circuit 100 in a link test configuration. The testing circuit 100 tests a cable 110 which provides a communication path between a telecommunications closet end 112 and a telecommunications outlet end 114. The configuration of the testing circuit 100 shown in FIG. 1 is a "link configuration" intended for use in facilities still in the construction stage. The link configuration does not include user patch cords at either end of the cabling run as these cords are often not installed until after the facility is occupied. Because the link configuration does not include the two additional connections which would be added when the patch cords are connected, performance standards are more stringent for cabling tested using the link configuration.

A main unit 116 and a remote unit 118 attach to the link under test, the cable 110, via special link test probes 120a and 120b respectively. The link test probes 120a and 120b are provided with interfaces 122a and 122b for connection to the main unit 116 and the remote unit 118 respectively. The link test probes 120a and 120b are typically terminated at their opposite ends with male modular-8 plugs 124a and 124b, respectively, for connection to the telecommunications closet end 112 and the telecommunications outlet end 114, respectively.

FIG. 2 is a diagram of a known testing circuit 200 in a channel test configuration. The testing circuit 200, like the testing circuit 100, tests a cable 110 which provides a communication path between a telecommunications closet end 112 and a telecommunications outlet end 114. In addition, the test produced by the testing circuit 200 includes the effect of user patch cords 220a and 220b, thereby providing a comprehensive end-to-end cabling performance certification. The patch cords are typically created as the network is going live, and, as such, a channel test is typically performed after the facilities have been constructed, either as a final test prior to going live, or to diagnose subsequent problems. The pass/fail limits applied when testing with the channel configuration will typically be less stringent than for the link configuration A main unit 116 and a remote unit 118 attach to the link under test, the cable 110 and user patch cords 220a and 220b, via special channel probes 222a and 222b respectively. The channel probes 220a and 220b are provided with interfaces for connection to the main unit 116 and the remote unit 118, respectively. On the opposite ends, the channel probes 222a and 222b are typically terminated with female modular-8 plugs 122a and 122b, respectively, for connection to the user leads 220a and 220b, respectively.

One problem encountered when testing cables, and in particular category 6 cables, is correctly matching the test units (the main unit 116 and the remote unit 118) to the link under test. This is not as simple as picking between a link and a channel adapter, but rather a broad range of choices faces the user. There exist a multitude of different link probes, along with an equal multitude of channel probes. Not only do users have to select between link and channel probes, but they must also match the probe to the manufacture of the network. This choice is made more difficult by the physical similarities of the probes used, while the difference between a channel probe and a link probe may be self-evident, each of the various probes with the channel probe family or link probe family pretty much look exactly the same. Each probe starts with a tester unit interface and ends in a modular-8 connector. As will be discussed below, the choice of which probe to utilize is critical to obtaining accurate testing results.

The modular-8 connector (also known as the RJ-45), was originally designed for telephone and low rate (under 1 Mbps) data applications. Consequently, the mechanical arrangement of signal contacts is not optimized to address the crosstalk and reflection problems that appear at high data rates (over 100 Mbps). Many ingenious designs have been utilized to compensate for the inherently poor performance that results from the modular-8 contact geometry. In the previous generation of connector designs (category 5), most manufacturers used signal compensation in just the jack (female connector), leaving the plug (male connector) uncompensated. To achieve the higher performance levels required for category 6 and maintain backward compatibility with the modular-8 signal contact geometry, most connector manufacturers place compensation into both the plug and jack. It is important that the compensation techniques used in each plug and jack of the network be compatible. The interaction between incompatible plug and jack compensation designs produces worse performance than previous level 5 connectors. This is one reason why certification is so important Unfortunately, no standards currently exit for the physical and logical construction of category 6 connectors and associated compensation techniques. In fact, cables and connectors from different manufactures are often incompatible with each other. Accordingly, to construct a category 6 network, users have to make sure that they match the brand and type of category 6 plugs and jacks in order to achieve optimum system performance.

The requirement to match category 6 plugs and jacks also applies to the link probes and channel adapters used for cable certification testing. When testing category 6 or class E cabling runs, it is particularly important to use the test probes which are specifically designed to match the test configuration, performance category and manufacturer corresponding to the cabling to be tested. Failure to use the correctly matched probes will yield inaccurate measurements. For this reason, a cable tester must utilize a range line of vendor-specific category 6 link and channel adapters constructed with plugs and jacks from each of the major connector manufacturers. As noted above, because the cables and terminators all look the same, identification of the correct probe becomes a problem.

Another problem related to the use of modular 8 connectors is that after repeated insertion and extraction, they tend to wear out. This problem is more pronounced with the connectors on the probe because they see a tremendous amount of use. Worn out probe connectors affect the cable tester's ability to obtain an adequate electrical connection, thereby skewing test results producing erroneous certification data. Currently, the only way to check for worn connectors on a probe is to inspect the connectors visually and periodically bench test the probe to determine if the probes associated error factors lie within specification. As with many maintenance procedures, this such checks are rarely performed, resulting in unnecessary frustration and aggravation.

Yet another problem with current cable testers and testing methods is that they require constant calibration to provide accurate testing results. FIG. 3 is a diagram of a known cable tester calibration circuit. To ensure completely accurate testing with the main unit 116 and the remote unit 118, it is necessary to compensate for the effects of a channel probe 312 and/or a link probe (not shown). To perform calibration, a cable, such as a link cable 310, with known error values (obtained via bench tested) is used to connect the channel probe 312 (connected to the main unit 116) to the remote unit 118. The main unit 116 and the remote unit 118 run a calibration routine to determine the error terms associated with the cable tester. Then, prior to starting a calibration procedure, error terms associated with the probes being used (determined by bench measurement) must be manually entered into the main unit 116. The calibration procedure should be repeated frequently while the entering of error terms associated with the probes must be performed every time a new probe is use. In practice, this has been a problem, operators tend to be very busy and forget to regularly perform the calibration routine and, more importantly, fail to enter the probe's error terms creating erroneous certification data.

Accordingly, the present inventors have recognized a need for probes for cable testers that can assist the operator with configuration issues and track usage thereof.

SUMMARY OF THE INVENTION

The present invention provides test probes having a memory for storing configuration data, including error correction values, and a counter that logs a number of tests performed by the probe. As a result, a cable tester in accordance with the present invention can warn the user, prior to attempting a test procedure, if an attached test probe is inappropriate for selected test limits, either because it is the wrong probe or because of wear and tear. This helps the operator avoid wasting time testing with the wrong probe/ settings configuration. Once the probe had been correctly selected, the stored error correction factors allow the cable tester to compensate therefore reducing the need for repeated calibration procedures.

BRIEF DESCRIPTION OF THE DRAWINGS

These and other objects and advantages of the invention will become apparent and more readily appreciated from the following description of the preferred embodiments, taken in conjunction with the accompanying drawings of which.

DESCRIPTION OF THE PREFERRED EMBODIMENTS

Figure 1:
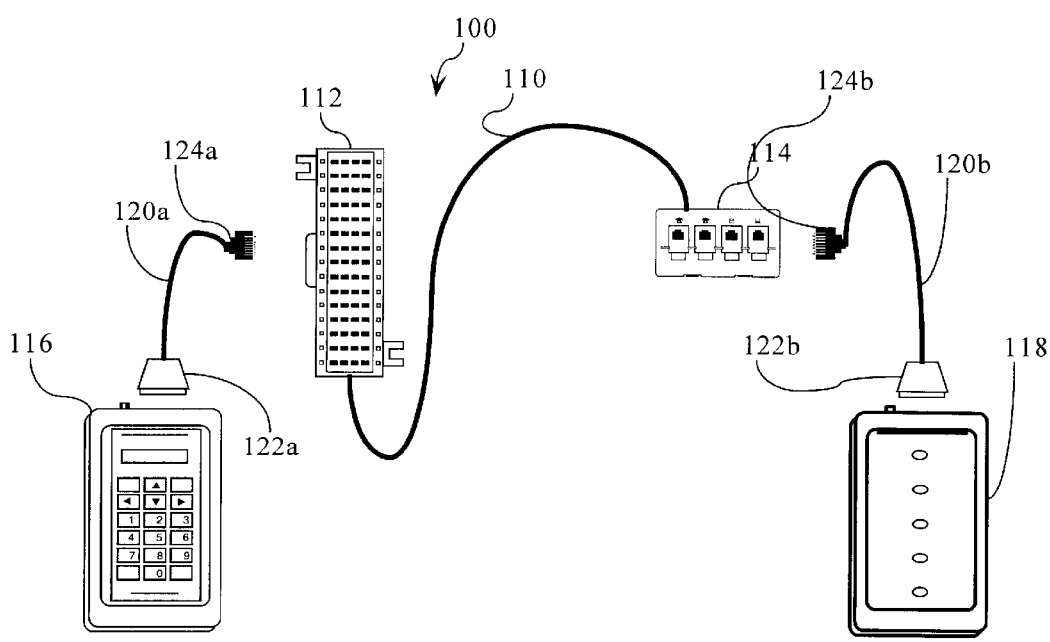
FIG. 1 is a diagram of a known testing circuit in a link test configuration.
Figure 2:
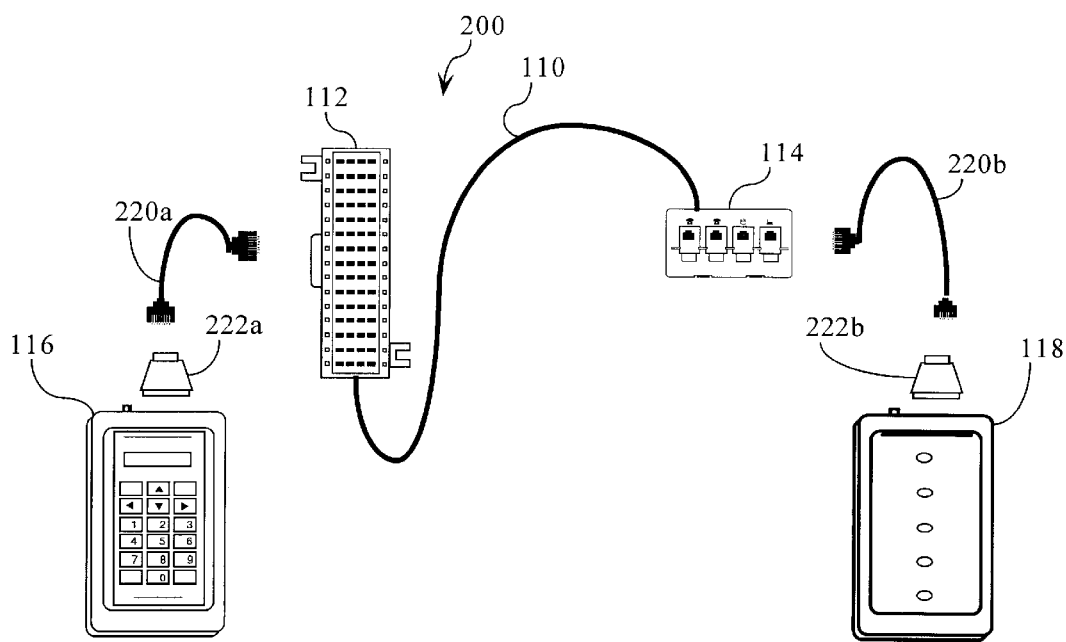
FIG. 2 is a diagram of a known testing circuit in a channel test configuration.
Figure 3:
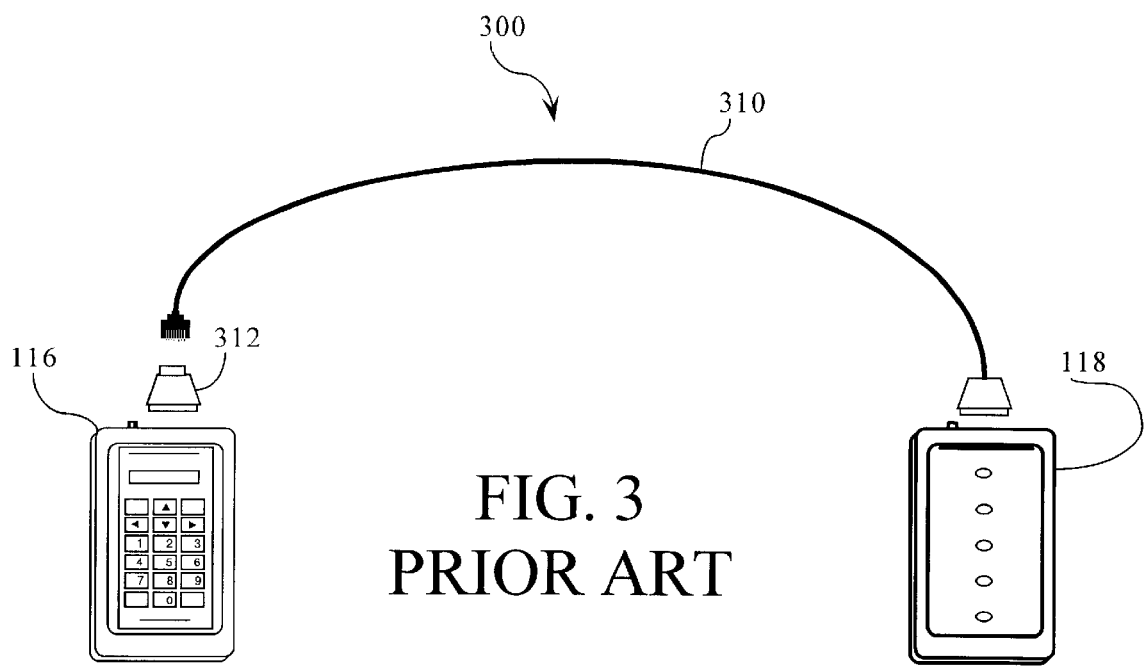
FIG. 3 is a diagram of a cable tester calibration circuit.

Reference will now be made in detail to the present preferred embodiments of the present invention, examples of which are illustrated in the accompanying drawings, wherein like reference numerals refer to like elements throughout.

The present invention provides a memory associated with a probe for a cable tester. The memory stores configuration data including error correction values so as to simplify the use of such probes in a cable testing procedure.

The detailed description which follows includes material presented in terms of routines and symbolic representations of operations of data bits within a memory, associated processors, and possibly networks, and network devices. These descriptions and representations are the means used by those skilled in the art effectively convey the substance of their work to others skilled in the art. A routine is here, and generally, conceived to be a self-consistent sequence of steps or actions leading to a desired result. Thus, the term "routine" is generally used to refer to a series of operations performed by a processor, be it a central processing unit of an ultrasound system, or a secondary processing unit of such an ultrasound system, and as such, encompasses such terms of art as "program," "objects," "functions," "subroutines," and "procedures."

In general, the sequence of steps in the routines require physical manipulation of physical quantities. Usually, though not necessarily, these quantities take the form of electrical or magnetic signals capable of being stored, transferred, combined, compared or otherwise manipulated. Those of ordinary skill in the art conveniently refer to these signals as "bits", "values", "elements", "symbols", "characters", "images", "terms", "numbers", or the like. It should be recognized that these and similar terms are to be associated with the appropriate physical quantities and are merely convenient labels applied to these quantities.

In the present case, the routines and operations are machine operations to be performed in conjunction with human operators. Useful machines for performing the operations of the present invention include the Agilent Technologies WIRESCOPE 350 and other similar devices. In general, the present invention relates to method steps, software, and associated hardware including a computer readable medium, configured to store and/or process electrical or other physical signals to generate other desired physical signals.

Figure 4A:
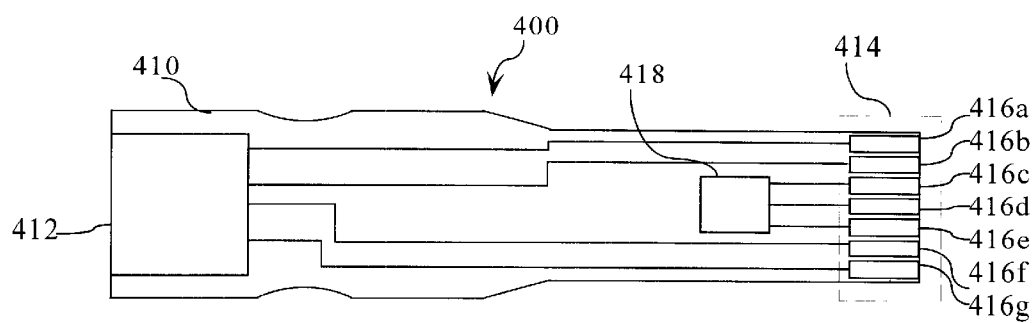
FIG. 4a is a simplified plan view of a probe in accordance with a preferred embodiment the present invention.
Figure 4B:
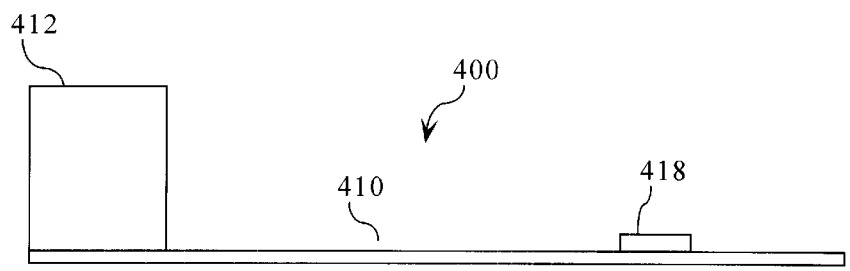
FIG. 4b is a simplified side view of a probe in accordance with a preferred embodiment of the present invention.

FIG. 4a is a simplified plan view of a probe in accordance with a preferred embodiment the present invention. FIG. 4b is a simplified side view of a probe in accordance with a preferred embodiment of the present invention. As stated above cable testing requires the use of a channel probe (also known as a channel adapter or "CA") or a link probe (also known as a basic link cable or "BL") to connect to a testing device (such as the main unit 116 and remote unit 118 shown in FIG. 1) to the cable under test. FIGS. 4a and 4b show an example suitable for use as a channel probe in accordance with the preferred embodiment of the present invention, but could also, with appropriate modification discussed below, be used as a link probe.

A printed circuit board (PCB) 410 is configured to support a modular 8 adapter 412 and electrically connect same to a similarly supported adapter 414 for connection to the main unit or remote unit of a cable tester. In the case of a channel probe, the modular 8 adapter would be a female jack. The adapter 414 electrically interfaces conductive pads 416a through 416g with connections in a reciprocal adapter in the main unit or remote unit of a cable tester. The channel probe 400 includes a memory 418, for example comprising a ROM, an EEPROM, a bubble memory, or the like. In FIG. 4a, pads 416a, 416b, 416f and 416g are connected to the modular 8 adapter 412, while pads 416c, 416d, and 416f are connected to the memory 418. The number and configuration of pads 416 has been simplified for purposes of illustration, and not all leads or visible circuitry has been portrayed. For example, those of ordinary skill in the art will recognize that a modular 8 adapter has 8 leads, each of which may or may not require a pad 416. Further, depending on the configuration of the memory 418, more or less leads may be required. Additionally, further circuitry may be required to enable access to the memory 418, such as resistors or capacitors. All such modification are well within the ability of those of ordinary skill in the art once a basic understanding of the present invention has been imparted.

Those of ordinary skill in the art will also recognize, that, with a few modifications, the structure shown in FIGS. 4a and 4b is also applicable to a link probe. The modular 8 adapter 412 would comprise a male modular 8 plug which could, if desired, be separated from the PCB 410 by a cable.

A CA or BL can be considered a two port network whose effect on a measurement can be mathematically canceled using known vector measurement techniques with four (4) error terms associated with the two-port network. The error terms are:

$e_{00}$–the equivalent directivity $e_{11}$–the port match $e_{10}e_{01}$–the reflection response $e_{30}$–the cross talk A detailed discussion of the various error terms can be found in: *An analysis of Vector Measurement Accuracy Enhancement Techniques* by Doug Ryting, available from Hewlett Packard, the content of which is incorporated herein by reference.

The current method for canceling the effects of a probe is to measure error terms associated with the probe and manually enter values for these error terms into the main unit of a cable tester each time the probe is used. The present inventors have recognized that by storing the error terms with, or in conjunction with the probe itself, that the problems associated with such manual entry can be reduced or eliminated.

Table 1 shows a highly simplified data structure for data contained in the memory 418 with respect to a certain frequency.

TABLE 1

| Serial # | Level | Type | Mfg. | Used | $e_{00}$ | $e_{11}$ | $e_{10}e_{01}$ | $e_{30}$ |
|---|---|---|---|---|---|---|---|---|
| 052631 | 6 | C | LUCENT | 35 | −35 dB, 15° | −25 dB, 100° | −4 dB, 10° | −60 dB, 240° |

The Serial # field allows a specific probe to be tracked so that overall performance can be analyzed and improvements implemented in future revisions. The Level field provides an indication of the level of certification for which the probe is configured. The Type field indicates the physical configuration of the probe (in this case a channel probe), while the Mfg. field indicates which manufacture's cables and connectors the probe is designed to interface with (in this case LUCENT). The Used field is a counter storing a number of times that the probe has been inserted into a test unit (either the main unit or the remote unit). The remaining fields store a variety of error terms, with only a single instance of each term ($e_{00}$, $e_{11}$, $e_{10}e_{01}$, $e_{30}$) being shown for purposes of illustration. A more detailed description of the number of error terms that must be stored is given below.

Figure 5:
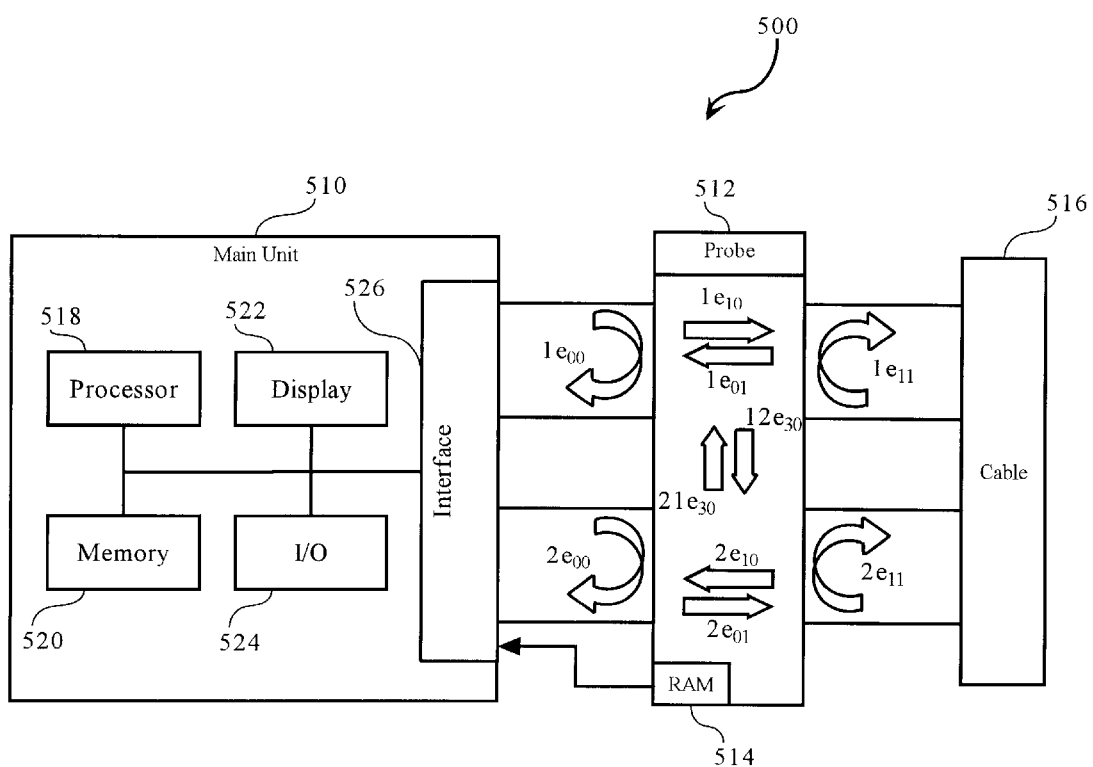
FIG. 5 is a block representation of a testing circuit in accordance with a preferred embodiment of the resent invention.

FIG. 5 is a block representation of a testing circuit in accordance with a preferred embodiment of the present invention. A main unit 510 is connected to a cable 516 via a probe 512. The probe 512 has a RAM 514 for storing, among other data, error terms associated with the probe 512. Those of ordinary skill in the art will recognize that a variety of other memory structures are applicable, such as ROM, EEPROM, SmartMedia™, DRAM, ect. . . The main unit 510 generally comprises: a processor 518; a memory 510; a display 522; an I/O unit 524; and an interface 526. The processor 518 may be any of a number of general purpose or specific processors operating under the direction of programs stored in the memory 520. Interaction with the user is provided with the display 522 and the I/O unit 524. A variety of options exist for the provision of such interaction, including a touch screen, LEDs, LCD panels, a keyboard and dedicated switches.

Generally, the I/O subsystem must be suitable to allow a user must be allowed to configure the main unit 510 in preparation for a certification procedure and to display the results of the certification procedure. This typically includes inputting a level of certification (and possibly thresholds for various criteria therein) along with other pertinent data, including a manufacturer of the cable. Accordingly, the features provided by the display 522 and I/O unit 524 will vary based on the cost and functionality of the main unit 510.

The interface 526 provides a connection for the probe 512. Again, the configuration of the interface 526 can vary widely based on the cost of the tester and the functionality sought to be imparted. The interface must be able to support the transfer of data from the RAM 514 to the memory 520 in addition to providing connection to each of the active leads in the cable 516.

FIG. 5 also indicates the location where the error factors, for two of the two-port networks created by linking the main unit 510 to the cable 516, are generated. Only two of the four two-port networks are shown for simplicities sake. Table 2 indicates the error terms present in all four of the two-port networks:

TABLE 2

| $1e_{00}$ | $1e_{11}$ | $1e_{10}1e_{01}$ | $12e_{30}$ | $13e_{30}$ | $14e_{30}$ |
| $2e_{00}$ | $2e_{11}$ | $2e_{10}2e_{01}$ | $21e_{30}$ | $23e_{30}$ | $24e_{30}$ |
| $3e_{00}$ | $3e_{11}$ | $3e_{10}3e_{01}$ | $31e_{30}$ | $32e_{30}$ | $34e_{30}$ |
| $4e_{00}$ | $4e_{11}$ | $4e_{10}4e_{01}$ | $41e_{30}$ | $42e_{30}$ | $43e_{30}$ |

Thus, the RAM 514 would hold each of the error terms listed in Table 2 in addition to the configurational data shown in Table 1.

Figure 6:
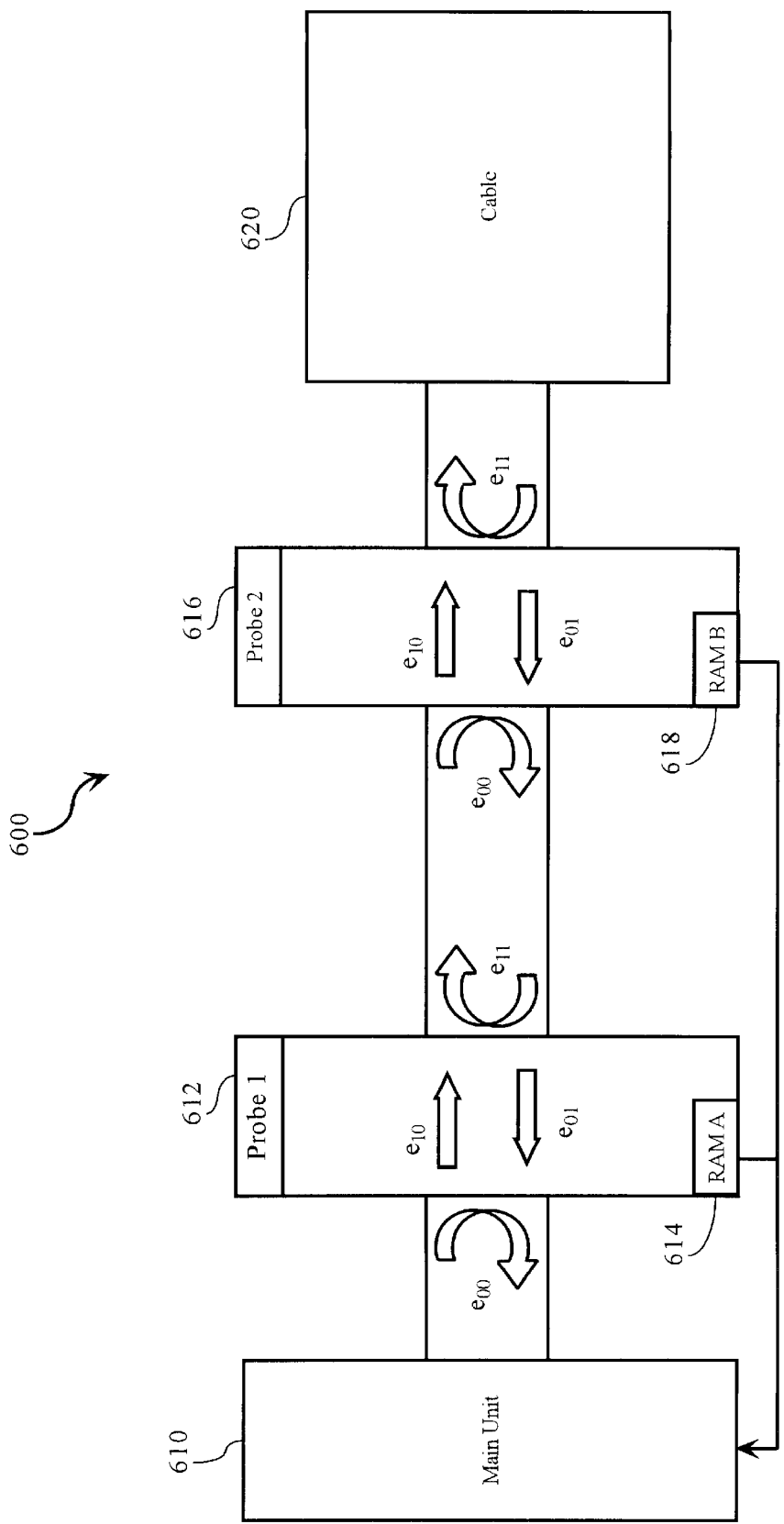
FIG. 6 is a block representation of a double testing circuit in accordance with a preferred embodiment of the present invention.

FIG. 6 is a block representation of a double testing circuit in accordance with a preferred embodiment of the present invention. A main unit 610 is connected to a cable 620 via a probe A 612 and a probe B 616. The probe A 612 has a RAM 614 for storing, among other data, error terms associated with the probe A 612. Similarly, probe B 616 has a RAM 618 for storing, among other data, error terms associated with the probe B 616. By using both sets of error terms, in a known manner, the entire test channel can be error compensated.

Figure 7:
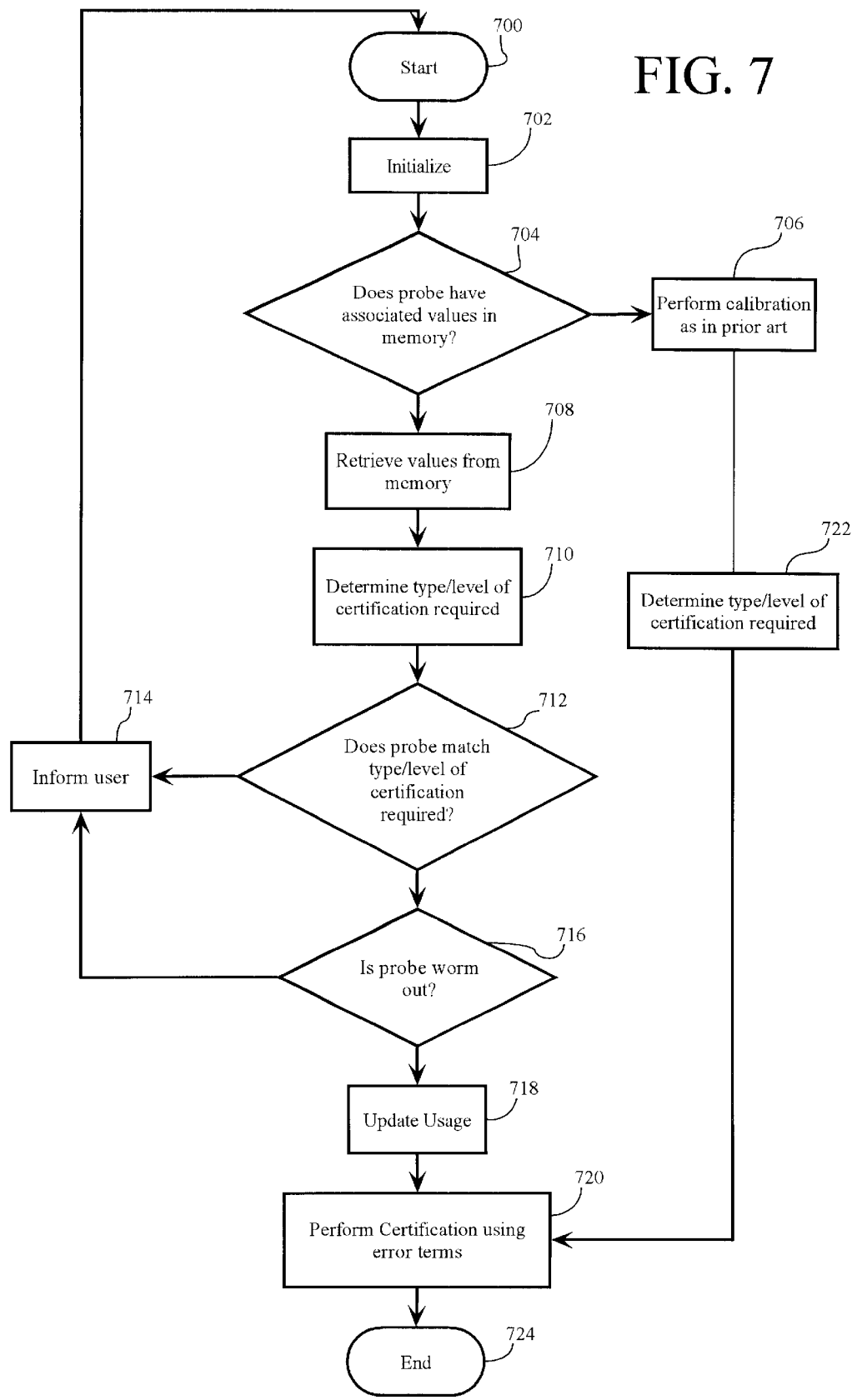
FIG. 7 is a flow chart of a testing procedure in accordance with a preferred embodiment of the present invention.

FIG. 7 is a flow chart of a testing procedure in accordance with a preferred embodiment of the present invention. The procedure starts in step 700. In step 702, the main unit 116 (see FIG. 1) and, if necessary, the remote unit 118 (see FIG. 1) of the cable tester are initialized. Subsequently, in step 704, a check is made as to whether the attached probe has associated configurational values stored in a memory, such as the RAM 514. If such values are not stored in a memory, the user is required to perform a calibration procedure as in the prior art, in step 706, to obtain the necessary error values.

If the attached probe does have configuration values stored in a memory, those values are retrieved in step 708. Next, in step 710, the type of certification required is determined, typically based on input by the user of the cable tester via the main unit 116. Such input typically includes a level of certification and a manufacture of the cable/ends. Thereafter, in step 712 the type of certification requested by the user is compared against the configuration values retrieved in step 708, and a determination is made as to whether the attached probe is the correct probe for the certification process. If an incorrect probe has been attached, the user is so informed in step 714 and the certification procedure is restarted. On the other hand if the correct probe is attached, the procedure proceeds to step 716 and a determination is made as to whether the probe is worn out by, for example, analyzing a used value in the memory 418 (see FIG. 4a and Table 1). If the probe is worn out, the user is informed in step 714 and the procedure is restarted.

If the probe is the correct probe for the certification procedure and not worn out, the value indicating probe usage (for example, the used value in the memory 418) is updated in step 716. Next, in step 720, a certification procedure is performed using the error terms retrieved in step 708. The details of the certification procedure will be omitted so as not to obscure the present invention. The procedure ends in step 724.

If, in step 704, the probe does not have associated values stored in a memory, subsequent to the manual calibration in step 706, the procedure goes to step 722 and the type of certification required is determined, typically based on input by the user of the cable tester via the main unit 116. As in the prior art, the user should also manually enter error terms associated with the probe into the main unit. Thereafter, the certification is performed in step 720.

In accordance with the foregoing, the present inventors have described apparatus and methods for testing cable installations to provide certification therefor. More specifically, the inventors have described a probe, and associated software and data, which simplifies the process of testing cables by storing configurational data in association with the probe. This represents a significant advance over the prior art which assumed some of the configurational data and required some configuration data to be manually entered.

Although a preferred embodiments of the present invention has been shown and described, it will be appreciated by those skilled in the art that changes may be made in this embodiment without departing from the principles and spirit of the invention, the scope of which is defined in the claims and their equivalents. For example, a single probe could store multiple sets of data for a variety of possible connections including equipment from multiple manufacturers. Then, depending on the test configuration, the appropriate set of data could be uploaded and used to provide correction.

What is claimed is:

1. A probe for a cable tester comprising:

a first interface for connection to the cable tester;

a second interface, connected to the first interface, for connection to a cable to be tested; and a memory, located in the probe and accessible by the cable tester, storing configuration data associated with the probe.

2. A probe, as set forth in claim 1, further comprising a body supporting the first interface, the second interface, and the memory.

3. A probe, as set forth in claim 2 wherein the body comprises a PCB.

4. A probe, as set forth in claim 1, wherein the memory is connected to the first interface.

5. A probe, as set forth in claim 1, wherein the probe is configured for use as a link probe.

6. A probe, as set forth in claim 1, wherein the probe is configured for use as a channel probe.

7. A probe, as set forth in claim 1, wherein the configuration data includes an indication of a manufacturer of a connector for which the probe is configured.

8. A probe, as set forth in claim 1, wherein the configuration data includes a certification level associated with the probe.

9. A probe, as set forth in claim 1, wherein the configuration data includes at least one error term associated with the probe.

10. A probe, as set forth in claim 9, wherein the at least one error term comprises: $e_{00}$; $e_{11}$; and $e_{10}e_{01}$.

11. A probe, as set forth in claim 1, wherein the configuration data includes a field storing an indication of the wear associated with the probe.

12. A probe, as set forth in claim 1, wherein the configuration data includes data for multiple configurations and/or manufacturers.

13. A cable testing device comprising:

a main unit;

a remote unit; and a plurality of detachable probes for interfacing with a cable to be tested, each of said probes comprising:

a first interface for connection to the main unit or the remote unit;

a second interface, connected to the first interface, for connection to the cable to be tested; and a memory, located on the probe and accessible by the main unit, storing configuration data associated with the probe.

14. A method of forming a probe for use with a cable tester comprising:

connecting a first interface, adapted for communication with the cable tester, to a second interface, adapted for communication with a cable to be tested;

placing a memory in the probe;

connecting the memory to the first interface; and storing configuration data associated with the probe in the memory.

15. A method, as set forth in claim 14, further comprising:

measuring at least one error term for a signal traveling from the first interface to the second interface; and wherein the step of storing the configuration data, comprises storing the at least one error term in the memory.

16. A method, as set forth in claim 14, wherein the configuration data includes an indication of the manufacturer of connector for which the probe is configured.

17. A method, as set forth in claim 14, further comprising:

after each use of the probe incrementing a counter in the memory.

18. A method of testing a cable with a probe, comprising:

storing error terms associated with the probe in a memory in the probe;

connecting the probe to a cable tester;

transferring the error terms from the memory in the probe to a memory in the cable tester;

connecting the probe to a cable to be tested; and testing the cable and correcting the results based in the error terms.

19. A method, as set forth in claim 18, further comprising:

after the step of connecting the probe incrementing a counter in the memory in the probe.

* * * * *